United States Patent
Van Den Homberg

[19]

[11] Patent Number: 6,111,473
[45] Date of Patent: Aug. 29, 2000

[54] INTEGRATED CIRCUIT COMPRISING AN OSCILLATOR

[75] Inventor: Johannes A. T. M. Van Den Homberg, Eindhoven, Netherlands

[73] Assignee: U.S. Philips Corporation, New York, N.Y.

[21] Appl. No.: 09/310,085

[22] Filed: May 11, 1999

[30] Foreign Application Priority Data

May 14, 1998 [EP] European Pat. Off. .............. 98201591

[51] Int. Cl.[7] ................................ H03B 5/12; H03B 5/36
[52] U.S. Cl. .............................. 331/116 FE; 331/117 FE; 331/116 R; 331/117 R; 331/108 C; 331/158; 331/179
[58] Field of Search ........................... 331/108 C, 116 R, 331/117 R, 116 FE, 117 FE, 117 D, 158, 179

[56] References Cited

U.S. PATENT DOCUMENTS

| | | | |
|---|---|---|---|
| 4,980,655 | 12/1990 | Whitehead | 331/158 |
| 4,994,764 | 2/1991 | Peters | 331/116 R |
| 5,063,359 | 11/1991 | Leonowich | 331/116 FE |
| 5,912,596 | 6/1999 | Ghoshal | 331/117 R |

OTHER PUBLICATIONS

"A One–Pin Crystal Oscillator for VLSI Circuits", by Joseph T. Santos et al., IEEE Journal of Solid–State Circuits, vol. 19, No. 2, Apr. 1984, pp. 228–235.

*Primary Examiner*—David Mis
*Attorney, Agent, or Firm*—Brian J. Wieghaus

[57] ABSTRACT

An integrated circuit (IC) comprising an oscillator (OSC) has a first amplifier ($AMP_1$) and a second amplifier ($AMP_2$). The first and the second amplifier ($AMP_1$, $AMP_2$) each have a non-inverting input, an inverting input, and an output. The output of the first amplifier ($AMP_1$) is connected to the non-inverting input of the first amplifier ($AMP_1$) and also to the non-inverting input of the second amplifier ($AMP_2$). The output of the second amplifier ($AMP_2$) is connected to the inverting input of the first amplifier ($AMP_1$) and also to the inverting input of the second amplifier ($AMP_2$). The first amplifier ($AMP_1$) is loaded with a capacitor (C) connected between the output of the first amplifier ($AMP_1$) and an external power supply terminal (1). The second amplifier ($AMP_2$) is loaded with a further capacitor ($C_F$) connected between the output of the second amplifier ($AMP_2$) and the external power supply terminal (1). A bias resistor RB is connected in parallel with the capacitor (C). A quartz-crystal (Q), for determining the frequency of the oscillator (OSC), is connected between the external power supply terminal (1) and an external signal terminal ($X_T$). The external signal terminal ($X_T$) is the only extra external terminal of the integrated circuit (IC) needed for the oscillator (OSC).

8 Claims, 3 Drawing Sheets

INTEGRATED CIRCUIT COMPRISING AN OSCILLATOR

BACKGROUND OF THE INVENTION

The invention relates to an integrated oscillator comprising an external resonator coupled between an external power supply terminal and an external signal terminal, the external signal terminal being the only external signal terminal needed for the integrated oscillator.

Such an integrated oscillator is disclosed in the IEEE Journal of Solid-State Circuits, Vol. SC-19, no. 2, April 1984, pages 228–235. Said publication discloses a crystal oscillator having a good frequency stability and a high reliability. The advantages of the integrated oscillator are that it requires only one external signal terminal and requires no other external components other than the crystal.

A drawback of the oscillator according to the above-mentioned publication it that it comprises at least one so called floating capacitor. Such a floating capacitor requires a relatively large area in the integrated oscillator.

SUMMARY OF THE INVENTION

It is an object of the invention to provide an improved integrated oscillator which eliminates the above mentioned drawback.

To this end, according to the invention, the integrated circuit of the type defined in the opening paragraph is characterized in that the oscillator further comprises a first amplifier having a non-inverting input coupled to the external signal terminal, an inverting input, and an output coupled to the non-inverting input; and a second amplifier having a non-inverting input coupled to the non-inverting input of the first amplifier, an inverting input coupled to the inverting input of the first amplifier, and an output coupled to the inverting input of the second amplifier.

Large capacitors can be avoided if the oscillator comprises only capacitors which each have at least one electrode electrically connected to the external power supply terminal. Such a capacitor is called a non-floating capacitor. The use of non-floating capacitors makes it possible to utilize the gate capacitance of an enhancement field effect transistor as a capacitor. An enhancement field effect transistor used as a capacitor does not require a large area in the integrated oscillator.

BRIEF DESCRIPTION OF THE DRAWINGS

The invention will be described in more detail with reference to the accompanying drawings, in which.

In these Figures parts or elements having like functions or purposes bear the same reference symbols.

DESCRIPTION OF THE PREFERRED EMBODIMENTS

Figure 1:
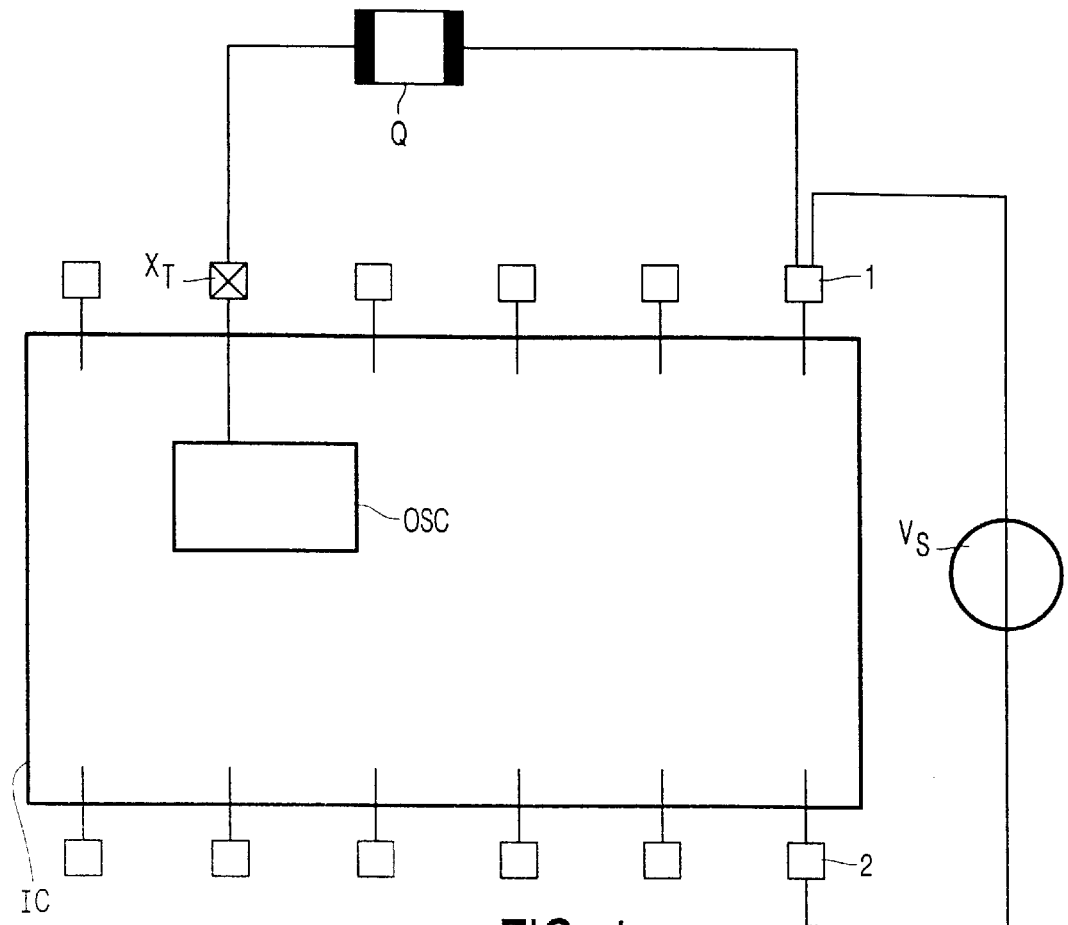
FIG. 1 shows an integrated circuit comprising an oscillator according to the invention.

FIG. 1 is a diagram of an integrated circuit IC comprising an oscillator OSC according to the invention. The integrated circuit IC is powered by a voltage source $V_S$ which is connected between an external power supply terminal 1 and a further external power supply terminal 2 of the integrated circuit IC. The integrated circuit IC has an external signal terminal $X_T$. The external signal terminal $X_T$ is the only external signal terminal of the integrated circuit IC required for the oscillator OSC. A resonator Q, which is implemented as a quartz-crystal, is connected between the external signal terminal $X_T$ and the external power supply terminal 1.

Figure 2:
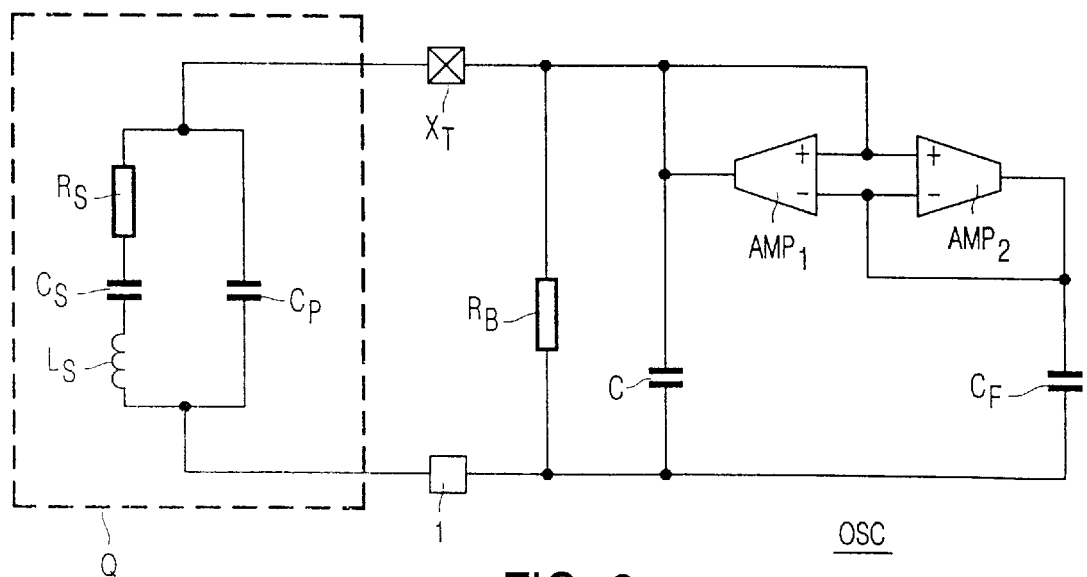
FIG. 2 is an electrical circuit diagram of an embodiment of an oscillator according to the invention.

FIG. 2 shows an electrical circuit diagram of an embodiment of an integrated oscillator according to the invention. The oscillator comprises a first amplifier $AMP_1$ and a second amplifier $AMP_2$. The first and the second amplifier $AMP_1$, $AMP_2$ each have a non-inverting input, an inverting input, and an output. The output of the first amplifier $AMP_1$ is connected to the non-inverting input of the first amplifier $AMP_1$ and also to the non-inverting input of the second amplifier $AMP_2$. The output of the second amplifier $AMP_2$ is connected to the inverting input of the first amplifier $AMP_1$ and also to the inverting input of the second amplifier $AMP_2$. The first amplifier $AMP_1$ is loaded with a capacitor C which is connected between the output of the first amplifier $AMP_1$ and the external power supply terminal 1. The second amplifier $AMP_2$ is loaded with a capacitor $C_F$ which is connected between the output of the second amplifier $AMP_2$ and the external power supply terminal 1. A bias resistor $R_B$ is connected in parallel with the capacitor C. To clarify the operation of the oscillator FIG. 2 shows a simplified electrical model of the quartz-crystal. The model comprises a series resistor $R_S$, a series capacitor $C_S$, a series inductor $L_S$, and a parallel capacitor $C_P$. The series resistor $R_S$, the series capacitor $C_S$, and the series inductor $L_S$ are arranged in series with each other between the external signal terminal $X_T$ and the external power supply terminal 1. The parallel capacitor $C_P$ is connected between the external signal terminal $X_T$ and the external power supply terminal 1.

The operation of the oscillator is as follows. Since the output of the first amplifier $AMP_1$ is connected to the non-inverting input of the first amplifier $AMP_1$, and thus a positive feedback loop is formed, this first amplifier $AMP_1$ forms a negative resistance. This negative resistance can compensate for the effect of a positive resistance of the quartz-crystal and for the effect of the positive resistance of the bias resistor $R_B$. As a consequence, the oscillator OSC will oscillate in parallel mode resonance. However, because the positive feedback loop is also active for direct voltages/currents 2 stable d.c. setting of the oscillator OSC can not be guaranteed. The main task of the second amplifier $AMP_2$ is to guarantee a stable d.c. setting of the oscillator OSC. Since the output of the second amplifier $AMP_2$ is connected to the inverting input of the second amplifier $AMP_2$, a negative feedback loop is formed. The d.c. setting of the oscillator OSC depends both on the positive and the negative feedback loop. A stable d.c. setting of the oscillator OSC is guaranteed when the effect of the negative feedback loop predominates over the effect of the positive feedback loop. This is the case, for example, when both the first and the second amplifier $AMP_1$, $AMP_2$ are identical. In that case the gain of the first amplifier $AMP_1$ is lower than the gain of the second amplifier $AMP_2$. This is because for direct current the first amplifier $AMP_1$ is loaded by a d.c. resistance (namely by the bias resistor $R_B$) whereas the second amplifier $AMP_2$ is not loaded by a d.c. resistance.

Together with the output impedance of the second amplifier $AMP_2$ the further capacitor $C_F$ forms a low-pass filter. Thus it is avoided that the negative feedback loop is also active for alternating current. Otherwise, the effect of the negative resistance formed by the first amplifier $AMP_1$ would be cancelled and, consequently, the oscillator OSC would not oscillate. The capacitor C is basically not necessary but is inherently always present because of the (parasitic) capacitance of a bond pad of the integrated circuit IC, which bond pad is connected to the external signal terminal $X_T$, and also because of the (parasitic) capacitance of the external signal terminal $X_T$. The capacitor C can, however, also be added intentionally if the parasitic capacitance is not high enough. Together with the output impedance of the first amplifier $AMP_1$, the capacitor C also forms a low-pass filter.

Now the situation is considered in which the first and the second amplifier $AMP_1$, $AMP_2$ are identical and the capacitance of the capacitor C is higher than the capacitance of the further capacitor $C_F$. In this situation the first amplifier $AMP_1$ is loaded more heavily for alternating current than the second amplifier $AMP_2$. The consequence of this is that the negative feedback loop is dominant in respect of the positive feedback loop. For this reason, it seems that the oscillator OSC will not oscillate. The frequency at which the oscillator is normally expected to oscillate is referred to as the target frequency. At the target frequency the impedance formed by the quartz-crystal Q and the capacitor C, is real (and high), i.e. it has no imaginary component. At the target frequency the capacitor C, therefore does not form a filter function. The consequence is that at the target frequency the positive feedback loop prevails over the negative feedback loop. This means that the oscillator OSC will oscillate despite the fact that the capacitor C has a capacitance which is higher than the further capacitance $C_F$. In practice, an advantageous dimensioning of the oscillator OSC is obtained when the capacitance of the capacitor C is slightly higher than the capacitance of the further capacitor $C_F$.

If the capacitance of the capacitor C is higher than the further capacitance $C_F$, then the negative feedback loop prevails over the positive feedback loop for all frequencies except for the target frequency. This has the advantage that it is guaranteed that the oscillator can oscillate only at the target frequency. The well-known problem of quartz-crystal oscillators that oscillation can occur at a so called wrong overtone frequency, is thus avoided. It also guarantees that the oscillator OSC cannot oscillate if the quartz-crystal is removed.

The oscillator OSC can also be provided with an amplitude control circuit (not shown in the Figures) for reducing the gain of the first and the second amplifier $AMP_1$, $AMP_2$. This can be accomplished, for example, by reducing the currents through the first and the second transistor $T_1$, $T_2$. As a result, the oscillator signal, which can be taken, for example, from the output of the first amplifier $AMP_1$, can be a pure sinewave, which means that the distortion of the output signal is very low. It is to be noticed further that a so called rail-to-rail output swing of the oscillator signal is allowed.

For some applications it might be advantageous not to use the oscillator OSC of the integrated circuit IC but to use another external (rail-to-rail) clock signal instead. If the external rail-to-rail clock signal is supplied to the external signal terminal XT, the amplitude control circuit automatically disables the oscillator OSC.

Though it is very practical to make the first and the second amplifier $AMP_1$, $AMP_2$ identical, as has been assumed until now, this is not really necessary. In order to obtain all the above-mentioned advantages it is sufficient to implement the first and the second amplifier $AMP_1$, $AMP_2$ together with the capacitor C and the further capacitor $C_F$ in such a way that the positive feedback loop prevails over the negative feedback loop for all frequencies except for the target frequency.

Figure 3:
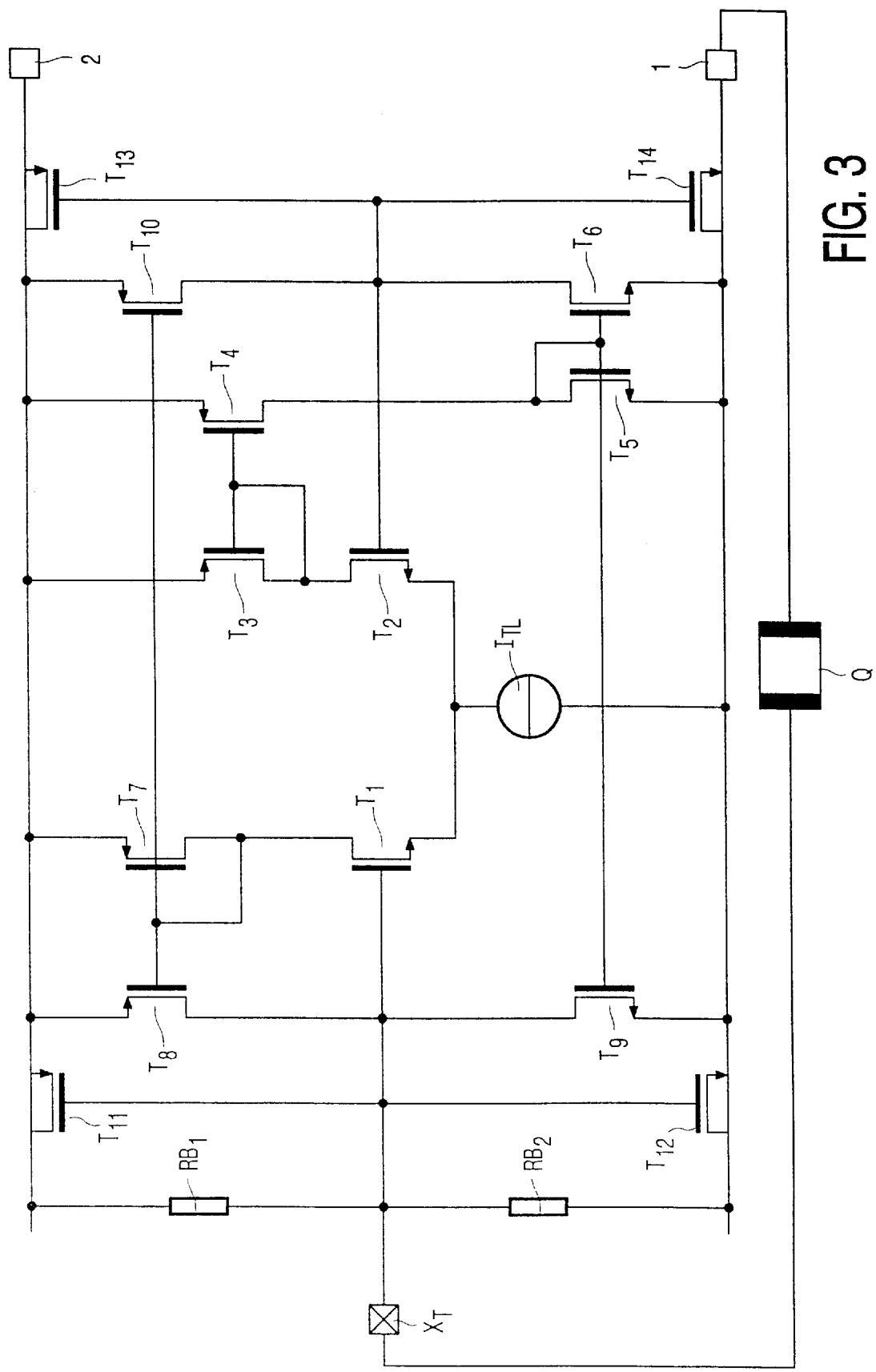
FIG. 3 is an electrical circuit diagram of a further embodiment of an oscillator according to the invention.

FIG. 3 shows an electrical circuit diagram of a further embodiment of the oscillator OSC according to the invention. The oscillator OSC comprises a first transistor $T_1$ having a control electrode connected to the external signal terminal $X_T$, a first main electrode, and a second main electrode; a second transistor $T_2$ having a control electrode, a first main electrode connected to the first main electrode of the first transistor $T_1$, and a second main electrode; a third transistor $T_3$ having a control electrode, a first main electrode connected to the further external power supply terminal 2, and a second main electrode connected to the control electrode, and to the second main electrode of the second transistor $T_2$; a fourth transistor $T_4$ having a control electrode connected to the control electrode of the third transistor $T_3$, a first main electrode connected to the further external power supply terminal 2, and a second main electrode; a fifth transistor $T_5$ having a control electrode connected to the second main electrode of the fourth transistor $T_4$, a first main electrode connected to the external power supply terminal 1, and a second main electrode connected to the control electrode; a sixth transistor $T_6$ having a control electrode connected to the control electrode of the fifth transistor $T_5$, a first main electrode connected to the external power supply terminal 1, and a second main electrode connected to the control electrode of the second transistor $T_2$; a seventh transistor $T_7$ having a control electrode connected to the second main electrode of the first transistor $T_1$, a first main electrode connected to the further external power supply terminal 2, and a second main electrode connected to the control electrode; an eighth transistor $T_8$ having a control electrode connected to the control electrode of the seventh transistor $T_7$, a first main electrode connected to the further external power supply terminal 2, and a second main electrode connected to the control electrode of the first transistor $T_1$; a ninth transistor $T_9$ having a control electrode connected to the control electrode of the fifth transistor $T_5$, a first main electrode connected to the external power supply terminal 1, and a second main electrode connected to the control electrode of the first transistor $T_1$; a tenth transistor $T_{10}$ having a control electrode connected to the control electrode of the seventh transistor $T_7$, a first main electrode connected to the further external power supply terminal 2, and a second main electrode connected to the control electrode of the second transistor $T_2$; and a current source $I_{TL}$ connected between the first main electrode of the first transistor $T_1$ and the external power supply terminal 1, for supplying current through the first transistor $T_1$ and the second transistor $T_2$. The first to the tenth transistor $T_1$–$T_{10}$ and the current source $I_{TL}$ form a variant of the first and the second amplifier $AMP_1$, $AMP_2$ as shown in FIG. 2. The first and the second transistor $T_1$, $T_2$ form a differential pair for both the first and the second amplifier $AMP_1$, $AMP_2$. this means that the control electrode of the first transistor $T_1$ forms the non-inverting input of the first amplifier $AMP_1$ and also of the second amplifier $AMP_2$, and that the control electrode of the second transistor $T_2$ forms the inverting input of the first amplifier $AMP_1$ and also of the second amplifier $AMP_2$. The oscillator further comprises an eleventh transistor $T_{11}$ having a gate connected to the control electrode of the first transistor $T_1$, and a source and a drain which are both connected to the further external power supply terminal 2; a twelfth transistor $T_{12}$ having a gate connected to the control electrode of the first transistor $T_1$, and a source and a drain which are both connected to the external power supply terminal 1; a thirteenth transistor $T_{13}$ having a gate connected to the control electrode of the second transistor $T_2$, and a source and a drain which are both connected to the further external power supply terminal 2; a fourteenth transistor $T_{14}$ having a gate connected to the control electrode of the second transistor $T_2$, and a source and a drain which are both connected to the external power supply terminal 1; a first resistor $RB_1$ connected between the further external power supply terminal 2 and the control electrode of the first transistor $T_1$; and a second resistor $RB_2$ connected between the control electrode of the first transistor $T_1$ and the external power supply terminal 1. The combination of the first and second resistors $RB_1$, $RB_2$ is equivalent to the bias resistor RB as shown in FIG. 2. The combination of the eleventh transistor $T_1$, and the twelfth transistor $T_{12}$, and the combination of thirteenth transistor $T_{13}$ and the fourteenth transistor $T_{14}$ are equivalent to, respectively, the capacitor C and the further capacitor $C_F$, as shown in FIG. 2.

It is to be noticed that the first and the second amplifier $AMP_1$, $AMP_2$, in fact, take the form of operational transconductance amplifiers (OTAs).

Figure 4:
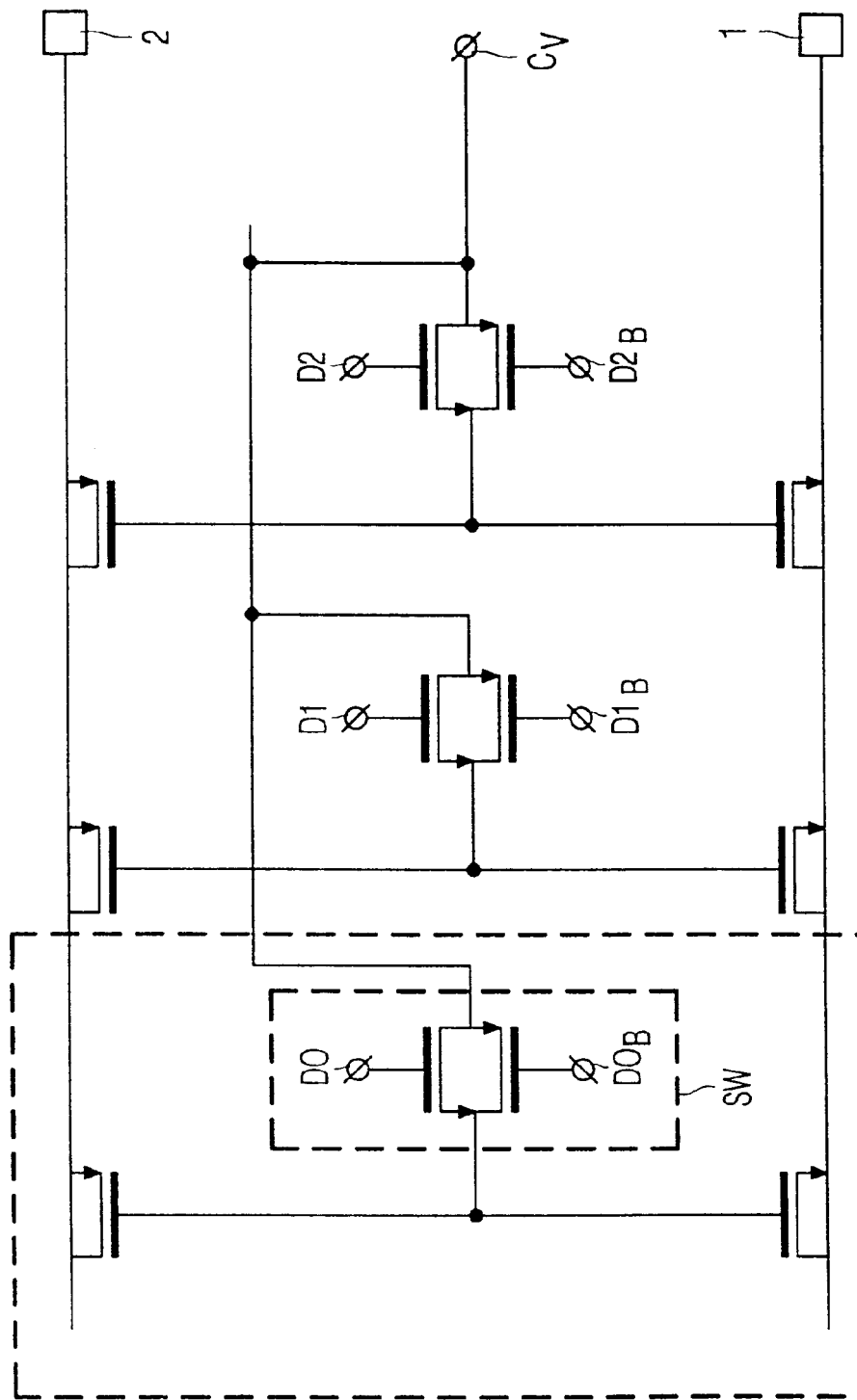
FIG. 4 is an electrical circuit diagram of a capacitor bank which can be used in the embodiments according to the invention.

FIG. 4 shows an electrical circuit diagram of a capacitor bank which can be used in the embodiments of the invention. For some applications in integrated circuits it is desirable that the capacitance of the capacitor C and/or the further capacitor $C_F$ can easily be adapted. This is the case, for example, if the oscillator OSC is used in a Phase Locked Loop (PLL) system, for which it is necessary that the frequency of the oscillator can be varied slightly. For this purpose, the capacitor bank as shown in FIG. 4 can be used as a variable capacitor. The capacitor bank comprises several stages STGS. By way of example, the number of stages STGS as shown in FIG. 4 is three. Each stage comprises a capacitor which, by way of example, is formed in the same way as the capacitor C formed by the eleventh and the twelfth transistor $T_{11}$, $T_{12}$ as shown in FIG. 3. Each stage further comprises a switch SW for connecting its associated capacitor to the output terminal $C_V$ of the capacitor bank, which switch is formed, for example, by a so called passgate comprising a parallel arrangement of an N-channel transistor and a P-channel transistor. By applying a logic "high" or a logic "low" voltage level to the switches of the stages STGS, the number of capacitors connected to the output terminal $C_V$ can be programmed. It is to be noticed that generally capacitor banks cannot be used in oscillators in which the capacitor which must be variable is a floating capacitor. This is caused by parasitic capacitances of the switches of the capacitor bank. However, since the oscillator OSC of the invention comprises only non-floating capacitors (C, $C_F$) the capacitor bank is very suitable for use in the oscillator OSC.

The resonator Q can also be formed by a combination circuit of an external capacitor and an external coil. The oscillator signal supplied by the oscillator OSC can be taken from various terminals/nodes of the oscillator OSC, for example from the external signal terminal $X_T$ or from the output of the second amplifier $AMP_2$. The first to the tenth transistor $T_1$–$T_{10}$ can be formed by all types of transistors, for example bipolar transistors or MOS-transistors.

What is claimed is:

1. An integrated oscillator comprising an external resonator (Q) coupled between an external power supply terminal (1) and an external signal terminal ($X_T$), the external signal terminal ($X_T$) being the only external signal terminal needed for the integrated oscillator (OSC), characterized in that the oscillator further comprises a first amplifier ($AMP_1$) having a non-inverting input coupled to the external signal terminal ($X_T$), an inverting input, and an output coupled to the non-inverting input; and a second amplifier ($AMP_2$) having a non-inverting input coupled to the non-inverting input of the first amplifier ($AMP_1$), an inverting input coupled to the inverting input of the first amplifier ($AMP_1$), and an output coupled to the inverting input of the second amplifier ($AMP_2$).

2. An integrated oscillator as claimed in claim 1, characterized in that of the first ($AMP_1$) and the second ($AMP_2$) amplifier at least one amplifier is an operational transconductance amplifier.

3. An integrated oscillator as claimed in claim 1, characterized in that the output of the first amplifier ($AMP_1$) is loaded with a capacitor (C).

4. An integrated circuit as claimed in claim 1, characterized in that the output of the second amplifier ($AMP_2$) is loaded with a further capacitor ($C_F$).

5. An integrated oscillator as claimed in claim 1, characterized in that the external resonator (Q) comprises a piezoelectric element.

6. An integrated oscillator as claimed in claim 1, characterized in that the external resonator (Q) comprises a combination circuit of an external capacitor and an external coil.

7. An integrated oscillator as claimed in claim 1, characterized in that the first ($AMP_1$) and the second ($AMP_2$) amplifier are operational transconductance amplifiers which are loaded with capacitors (C, $C_F$) at outputs of the transconductance amplifiers, and the external resonator (Q) comprises a piezoelectric element.

8. An integrated oscillator as claimed in claim 7, characterized in that at least one of the capacitors (C, $C_F$) comprises a capacitor bank.

* * * * *